(12) United States Patent
Lee

(10) Patent No.: US 11,093,390 B2
(45) Date of Patent: Aug. 17, 2021

(54) MEMORY SYSTEM AND OPERATING METHOD THEREOF

(71) Applicant: SK hynix Inc., Gyeonggi-do (KR)

(72) Inventor: Joo-Young Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 10 days.

(21) Appl. No.: 16/599,919

(22) Filed: Oct. 11, 2019

(65) Prior Publication Data
US 2020/0192796 A1  Jun. 18, 2020

(30) Foreign Application Priority Data
Dec. 12, 2018 (KR) .................. 10-2018-0159971

(51) Int. Cl.
*G06F 12/06* (2006.01)
*G11C 29/44* (2006.01)

(52) U.S. Cl.
CPC .......... *G06F 12/0646* (2013.01); *G11C 29/44* (2013.01); *G06F 2212/1032* (2013.01)

(58) Field of Classification Search
None
See application file for complete search history.

(56) References Cited

U.S. PATENT DOCUMENTS

| 6,823,349 B1* | 11/2004 | Taylor | G06F 11/2082 |
| 10,861,581 B2* | 12/2020 | Park | G11C 29/886 |
| 2018/0268921 A1* | 9/2018 | Lee | G11C 29/88 |

FOREIGN PATENT DOCUMENTS

| KR | 10-2018-0026876 | 3/2018 |
| KR | 10-2018-0060524 | 6/2018 |

* cited by examiner

*Primary Examiner* — Phung M Chung
(74) *Attorney, Agent, or Firm* — IP & T Group LLP

(57) ABSTRACT

A memory system includes a memory device; a short super block detecting unit suitable for forming, when one or more initial bad blocks remain in an original super block after a re-mapping operation is performed and a number of the initial bad blocks is equal to or less than a predetermined threshold value within the original super block, a short super block with memory blocks included in the original super block; a bitmap generating unit suitable for generating a bitmap representing whether each of the memory blocks included in the short super block is a normal block or an initial bad block; and a processor suitable for controlling the memory device to simultaneously perform a normal operation on normal blocks among the memory blocks included in the short super block based on the bitmap.

15 Claims, 17 Drawing Sheets

FIG. 9

|        | PLANE1 | PLANE2 | PLANE3 | PLANE4 | 902 |
|--------|--------|--------|--------|--------|-----|
| INDEX_1 | 1 | 1 | 1 | 1 | |
| INDEX_2 | 1 | 1 | 1 | 1 | |
| INDEX_3 | 0 | 1 | 1 | 1 | |
| INDEX_4 | 0 | 1 | 1 | 1 | |

MEMORY SYSTEM AND OPERATING METHOD THEREOF

CROSS-REFERENCE TO RELATED APPLICATIONS

The present application claims priority of Korean Patent Application No. 10-2018-0159971, filed on Dec. 12, 2018, which is incorporated herein by reference in its entirety.

BACKGROUND

1. Field

Various embodiments of the present invention relate to a memory system, and more particularly, to a memory system for efficiently forming a super block and a method for operating the memory system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since memory systems have no moving parts, as compared with a hard disk device. Examples of memory systems having such advantages include universal serial bus (USB) memory devices, memory cards having various interfaces, and solid-state drives (SSD).

SUMMARY

Embodiments of the present invention are directed to a memory system that may form a short super block including an initial bad block, and may simultaneously access the normal blocks included in the short super block based on a bitmap representing whether or not a memory block has integrity.

In accordance with an embodiment of the present invention, a memory system includes: a memory device; a short super block detecting unit suitable for forming, when one or more initial bad blocks remain in an original super block after a re-mapping operation is performed and a number of the initial bad blocks is equal to or less than a predetermined threshold value within the original super block, a short super block with memory blocks included in the original super block; a bitmap generating unit suitable for generating a bitmap representing whether each of the memory blocks included in the short super block is a normal block or an initial bad block; and a processor suitable for controlling the memory device to simultaneously perform a normal operation on normal blocks among the memory blocks included in the short super block based on the bitmap.

In accordance with another embodiment of the present invention, a method for operating a memory system includes: forming, when one or more initial bad blocks remain in an original super block after a re-mapping operation is performed and a number of the initial bad blocks is equal to or less than a predetermined threshold value within the original super block, a short super block with memory blocks included in the original super block; generating a bitmap representing whether each of the memory blocks included in the short super block is a normal block or an initial bad block; and simultaneously performing a normal operation on normal blocks among the memory blocks included in the short super block based on the bitmap.

In accordance with another embodiment of the present invention, an operating method of a controller for controlling a memory device including a plurality of memory blocks selected from different planes, the memory blocks comprising one or more normal blocks and one or more initial bad blocks, the operating method includes: identifying the normal blocks and the initial bad blocks; and accessing the normal blocks as a super block.

These and other features and advantages of the present invention will become apparent to those skilled in the art of the invention from the following detailed description in conjunction with the following drawings.

BRIEF DESCRIPTION OF THE DRAWINGS

FIG. 9 illustrates a bitmap in accordance with an embodiment of the present invention.

DETAILED DESCRIPTION

Figure 1:
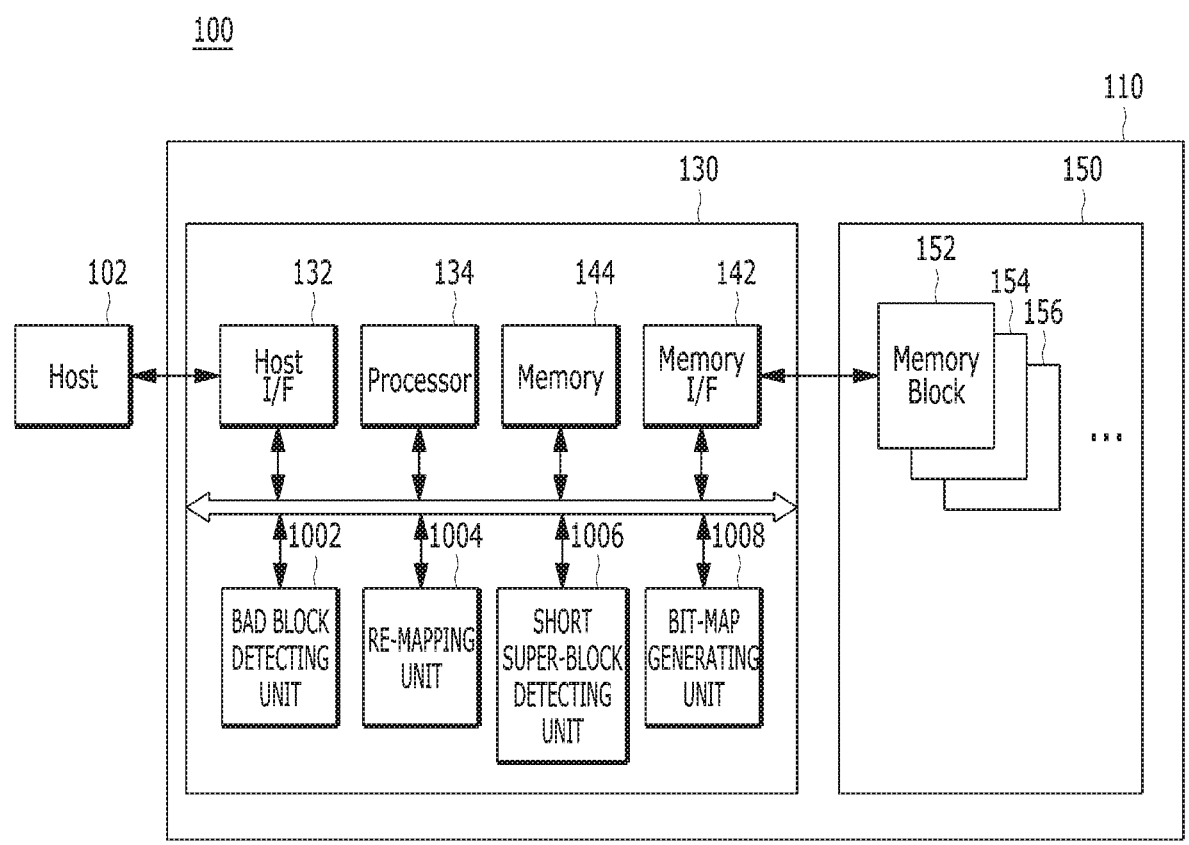
FIG. 1 is a block diagram illustrating a data processing system including a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s). It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The -described embodiments are merely for the purpose of understanding the technical spirit of the present disclosure and the scope of the present disclosure should not be limited to the described embodiments. It will be obvious to those skilled in the art to which the present disclosure pertains that other modifications based on the technical spirit of the present disclosure may be made in addition to the described embodiments.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include any of a variety of portable electronic devices such as a mobile phone, a MP3 player and a laptop computer, or any of a variety of non-portable electronic devices such as a desktop computer, a game machine, a TV and a projector.

The host 102 may include at least one OS (operating system) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of the memory system 110 include a solid-state drive (SSD), a multi-media card (MMC) and an embedded MMC (eMMC).

The memory system 110 may include various types of storage devices. Non-limiting examples of such storage devices include volatile memory devices such as a DRAM dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150 and a controller 130.

The controller 130 and the memory device 150 may be integrated into a single semiconductor device, which may be included in any of the various types of memory systems as described above. For example, the controller 130 and the memory device 150 may be integrated as a single semiconductor device to constitute an SSD, a PCMCIA (personal computer memory card international association) card, SD card including a mini-SD, a micro-SD and a SDHC, and an UFS device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156, each of which may include a plurality of pages, each of which may include a plurality of memory cells coupled to a word line. In an embodiment, the memory device 150 may be a flash memory having a 3-dimensional (3D) stack structure.

Herein, the structure of the memory device 150 and the three-dimensional stereoscopic stack structure of the memory device 150 will be described later with reference to FIGS. 11 to 13.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program, and erase operations of the memory device 150.

Specifically, the controller 130 may include a host interface (I/F) 132, a processor 134, a memory interface 142, and a memory 144, all operatively coupled or engaged via an internal bus. As to be described later on with reference to FIG. 10, the controller 130 may further include a bad block detecting unit 1002, a re-mapping unit 1004, a short-super block detecting unit 1006, and a bitmap generating unit 1008. The bad block detecting unit 1002, re-mapping unit 1004, short-super block detecting unit 1006, and bitmap generating unit 1008 include all circuits, systems, software, firmware and devices necessary for their respective operations and functions.

The host interface 132 may process a command and data of the host 102. The host interface 132 may communicate with the host 102 through one or more various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via a firmware, that is, a host interface layer (HIL) for exchanging data with the host 102.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130, and store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows the memory 144 disposed within the controller 130. In an embodiment, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache, and a map buffer/cache to store some data required to perform data write and read operations between the host 102 and the memory device 150, and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). The processor 134 may be implemented with a microprocessor or a central processing unit (CPU).

For example, the controller 130 may perform an operation requested by the host 102 in the memory device 150 through the processor 134, which is implemented as a microprocessor, a CPU, or the like. Also, the controller 130 may perform a background operation on the memory device 150 through the processor 134, which may be realized as a microprocessor or a CPU. The background operation performed on the memory device 150 may include an operation of copying and processing data stored in some memory blocks among the memory blocks 152 to 156 of the memory device 150 into other memory blocks, e.g., a garbage collection (GC) operation, an operation of performing swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156 in the memory device 150.

Figure 2:
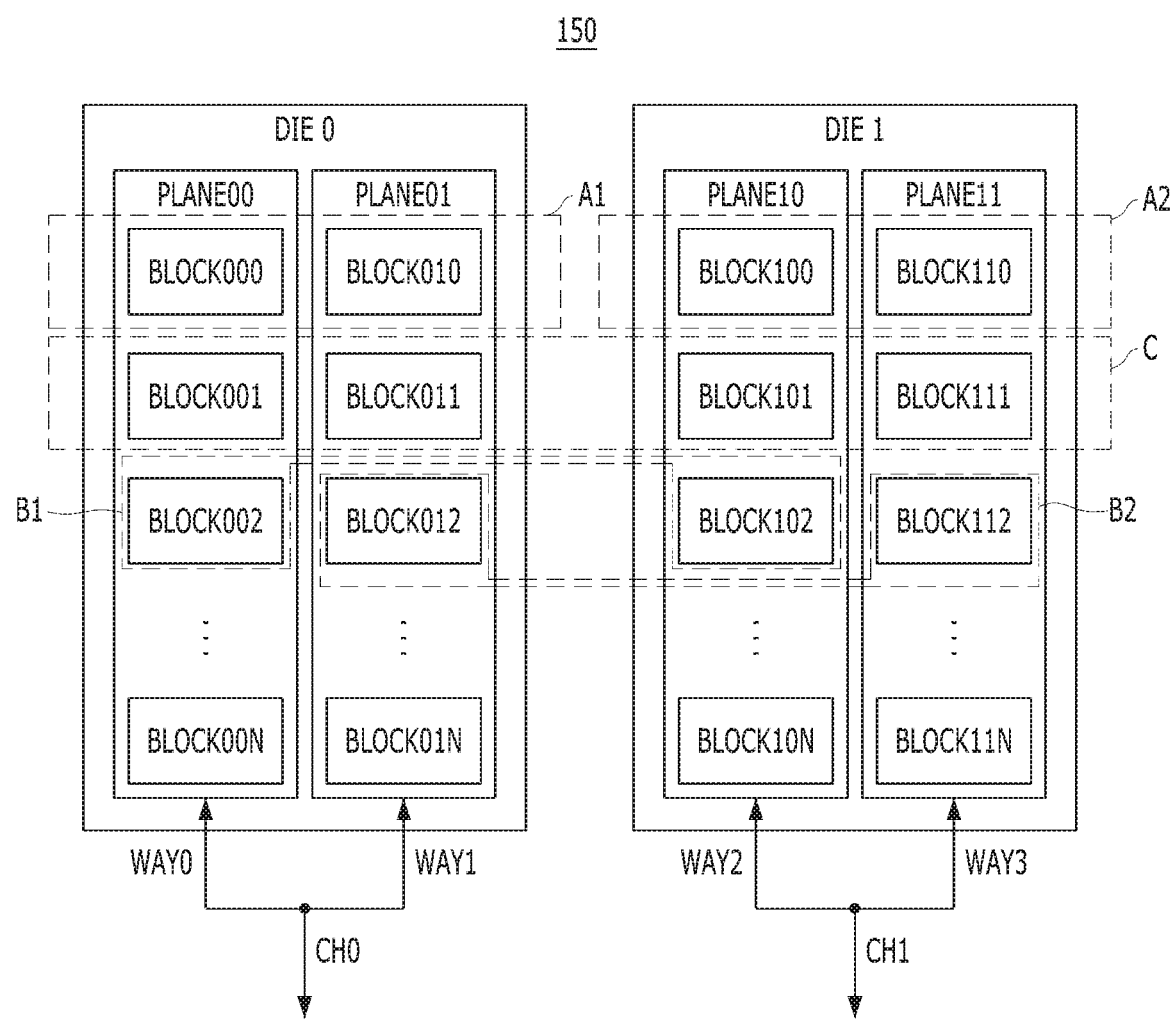
FIG. 2 is a block diagram illustrating an example of a super memory block used in a memory system in accordance with an embodiment of the present invention.

FIG. 2 is a diagram illustrating an example of a super memory block used in a memory system in accordance with an embodiment of the present invention.

FIG. 2 illustrates in detail constituent elements of the memory device 150 among the constituent element of the memory system 110 shown in FIG. 1 in accordance with an embodiment of the present invention.

The memory device 150 may include a plurality of memory blocks BLOCK000 to BLOCK00N, BLOCK010 to BLOCK01N, BLOCK100 to BLOCK10N and BLOCK110 to BLOCK11N.

In addition, the memory device 150 may include a first memory die DIE0 capable of inputting/outputting data through a zeroth channel CH0 and a second memory die DIE1 capable of inputting/outputting data through a first channel CH1. The zeroth and first channels CH0 and CH1 may input/output data in an interleaving scheme.

The first memory die DIE0 may include a plurality of planes PLANE00 and PLANE01 respectively corresponding to a plurality of ways WAY0 and WAY1. The ways WAY0 and WAY1 may input/output data in the interleaving scheme by sharing the zeroth channel CH0.

The second memory die DIE1 may include a plurality of planes PLANE 10 and PLANE 11 respectively corresponding to a plurality of ways WAY2 and WAY3. The ways WAY2 and WAY3 may input/output data in the interleaving scheme by sharing the first channel CH1.

The first plane PLANE00 of the first memory die DIE0 may include a predetermined number of memory blocks BLOCK000 to BLOCK00N among the plurality of memory blocks BLOCK000 to BLOCK00N, BLOCK010 to BLOCK01N, BLOCK100 to BLOCK10N and BLOCK110 to BLOCK11N.

The second plane PLANE01 of the first memory die DIE0 may include a predetermined number of memory blocks BLOCK010 to BLOCK01N among the plurality of memory blocks BLOCK000 to BLOCK00N, BLOCK010 to BLOCK01N, BLOCK100 to BLOCK10N and BLOCK110 to BLOCK11N.

The first plane PLANE10 of the second memory die DIE1 may include a predetermined number of memory blocks BLOCK100 to BLOCK10N among the plurality of memory blocks BLOCK000 to BLOCK00N, BLOCK010 to BLOCK01N, BLOCK100 to BLOCK10N and BLOCK110 to BLOCK11N.

The second plane PLANE11 of the second memory die DIE1 may include a predetermined number of memory blocks BLOCK110 to BLOCK11N among the plurality of memory blocks BLOCK000 to BLOCK00N, BLOCK010 to BLOCK01N, BLOCK100 to BLOCK10N and BLOCK110 to BLOCK11N.

In this manner, the plurality of memory blocks BLOCK000 to BLOCK00N, BLOCK010 to BLOCK01N, BLOCK100 to BLOCK10N and BLOCK110 to BLOCK11N included in the memory device 150 may be divided into groups, according to their physical locations and their use of the ways and channels.

Although it is described in the embodiment of the present invention that two memory dies DIE0 and DIE1 are included in the memory device 150, two planes PLANE00 and PLANE01/PLANE10 and PLANE11 are included in the respective memory dies DIE0 and DIE1, and the predetermined number of memory blocks BLOCK000 to BLOCK00N, BLOCK010 to BLOCK01N, BLOCK100 to BLOCK10N and BLOCK110 to BLOCK11N are included in the respective planes PLANE00 and PLANE01/PLANE10 and PLANE11, the invention is not limited in this way. In actuality, more or fewer memory dies than two may be included in the memory device 150, more or fewer planes than two may be included in the respective memory dies, according to the decision of a system designer. Additionally, the predetermined number of memory blocks included in the respective planes may be variously adjusted according to the decision of the system designer.

Differently from dividing the plurality of memory blocks BLOCK000 to BLOCK00N, BLOCK010 to BLOCK01N, BLOCK100 to BLOCK10N and BLOCK110 to BLOCK11N included in the memory device 150 depending on their physical locations such as the memory dies DIE0 and DIE1 or the planes PLANE00 and PLANE01/PLANE10 and PLANE11, the controller 130 may divide the plurality of memory blocks BLOCK000 to BLOCK00N, BLOCK010 to BLOCK01N, BLOCK100 to BLOCK10N and BLOCK110 to BLOCK11N on a basis of memory blocks which are simultaneously selected and operate there among. In other words, the controller 130 may manage a plurality of memory blocks which are located in different dies or different planes based on their physical locations, by grouping memory blocks capable of being selected simultaneously among the plurality of memory blocks and thereby dividing the grouped memory blocks into super memory blocks.

The simultaneous selection scheme of grouping the memory blocks into super memory blocks by the controller 130 may be performed in various manners according to the decision of the system designer. Herein, three simultaneous selection schemes will be exemplified as follows.

A first scheme is to group an arbitrary memory block BLOCK000 from the first plane PLANE00 and an arbitrary memory block BLOCK010 from the second plane PLANE01 of the first memory die DIE0 between the memory dies DIE0 and DIE1 included in the memory device 150 and manage the grouped memory blocks BLOCK000 and BLOCK010 as a single super memory block A1. When the first way is applied to the second memory die DIE1 between the memory dies DIE0 and DIE1 included in the memory device 150, the controller 130 may group an arbitrary memory block BLOCK100 from the first plane PLANE10 and an arbitrary memory block BLOCK110 from the second plane PLANE11 of the second memory die DIE1 and manage the grouped memory blocks BLOCK100 and BLOCK110 as a single super memory block A2.

A second scheme is to group an arbitrary memory block BLOCK002 from the first plane PLANE00 of the first memory die DIE0 and an arbitrary memory block BLOCK102 from the first plane PLANE10 of the second memory die DIE1 and manage the grouped memory blocks BLOCK002 and BLOCK102 as a single super memory block B1. In addition, according to the second way, the controller 130 may group an arbitrary memory block BLOCK012 from the second plane PLANE01 of the first memory die DIE0 and an arbitrary memory block BLOCK112 from the second plane PLANE11 of the second memory die DIE1 and manage the grouped memory blocks BLOCK012 and BLOCK112 as a single super memory block B2.

A third scheme is to group an arbitrary memory block BLOCK001 from the first plane PLANE00 of the first memory die DIE0, an arbitrary memory block BLOCK011 from the second plane PLANE01 of the first memory die DIE0, an arbitrary memory block BLOCK101 from the first plane PLANE10 of the second memory die DIE1, and an arbitrary memory block BLOCK111 from the second plane PLANE11 of the second memory die DIE1 and manage the grouped memory blocks BLOCK001, BLOCK011, BLOCK101 and BLOCK111 as a single super memory block C.

The simultaneously-selectable memory blocks included in the respective super memory blocks may be substantially simultaneously selected by the controller 130 through an interleaving scheme, for example, a channel interleaving scheme, a memory die interleaving scheme, a memory chip interleaving scheme, or a way interleaving scheme.

Figure 3:
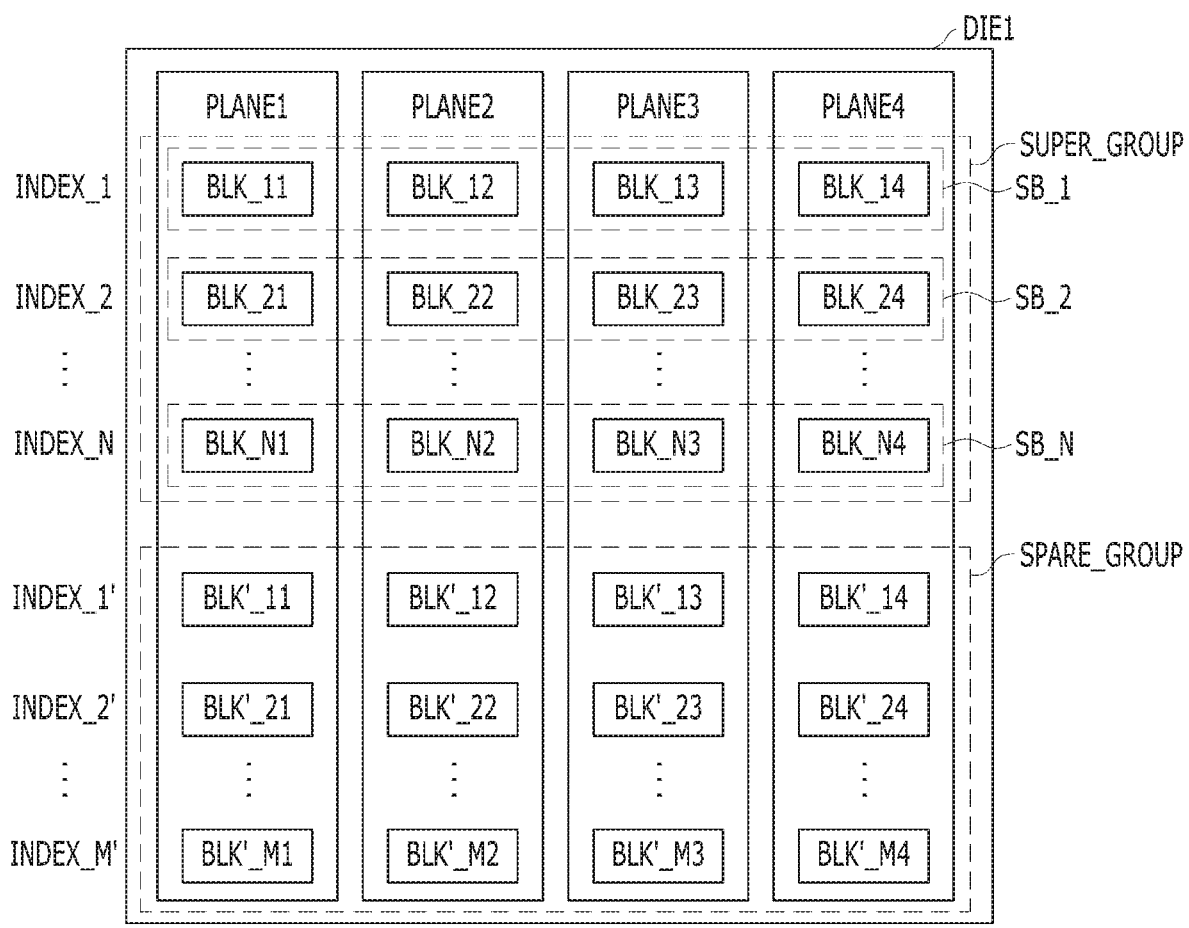
FIG. 3 is a block diagram illustrating an example of a super block group and a spare group.

FIG. 3 is a block diagram illustrating an example of a super block group and a spare group.

According to the example of FIG. 3, the controller 130 forms one super memory block with memory blocks included in each of the first to fourth planes PLANE1 to PLANE4 that are included in a first die DIE1.

The controller 130 may form one super memory block with memory blocks of the same index among the memory blocks included in each of the first to fourth planes PLANE1 to PLANE4. The memory blocks positioned in the same row among the memory blocks included in each of the first to fourth planes PLANE 1 to PLANE 4 may share the same index. For example, as shown in FIG. 3, the first memory blocks BLK_11 to BLK_14 respectively included in the first to fourth planes PLANE1 to PLANE4 may share a first index INDEX_1, and the controller 130 may form a first super memory block SB_1 with the first memory blocks BLK_11 to BLK_14 respectively included in the first to fourth planes PLANE1 to PLANE4. In a similar manner, the controller 130 may form second to $N^{th}$ super memory blocks SB_2 to SB_N respectively corresponding to the second to $N^{th}$ indices INDEX_2 to INDEX_N. The controller 130 may form a super block group SUPER_GROUP with the first to $N^{th}$ super memory blocks SB_1 to SB_N. The super block group SUPER_GROUP may include a memory block that is detected as a bad block in a test performed after a manufacturing process (hereinafter, referred to as an initial bad block), unlike a spare group SPARE_GROUP, which will be described later.

The controller 130 may form a spare group SPARE_GROUP with the remaining memory blocks, excluding the memory blocks included in the super block group SUPER_GROUP among the memory blocks included in the first to fourth planes PLANE1 to PLANE4. The memory blocks included in the spare group SPARE_GROUP may include only the normal blocks in a test that is performed after the manufacturing process. For example, the controller 130 may use the first to $N^{th}$ memory blocks BLK_11 to BLK_N1 among the memory blocks included in the first plane PLANE1 to form a super block group SUPER_GROUP, and may use 1' to $M^{th'}$ memory blocks BLK'_11 to BLK'_M1 to form a spare group SPARE_GROUP. Since the 1' to $M^{th}$ memory blocks BLK'_11 to BLK'_M1 are all the blocks that are determined to be normal blocks in the test performed after the manufacturing process, the 1' to $M^{th}$ memory blocks BLK'_11 to BLK'_M1 are secured with integrity. On the other hand, the first to $N^{th}$ memory blocks BLK_11 to BLK_N1 may not be necessarily secured with the integrity.

As to be described later, according to the prior art, only when all of the memory blocks of the same index among the memory blocks included in the first to fourth planes PLANE 1 to PLANE 4 are determined to be normal blocks, the controller 130 may form a super memory block with the memory blocks. When there is a memory block which is an initial bad block among the memory blocks included in the first to fourth planes PLANE1 to PLANE4, the controller 130 may perform a re-mapping operation of replacing the initial bad block with a memory block included in the same plane as the initial bad block among the memory blocks included in the spare group SPARE_GROUP. The controller 130 may form a super memory block with the memory blocks by performing a re-mapping operation, when all the memory blocks of the same index are determined to be normal blocks.

Figure 4:
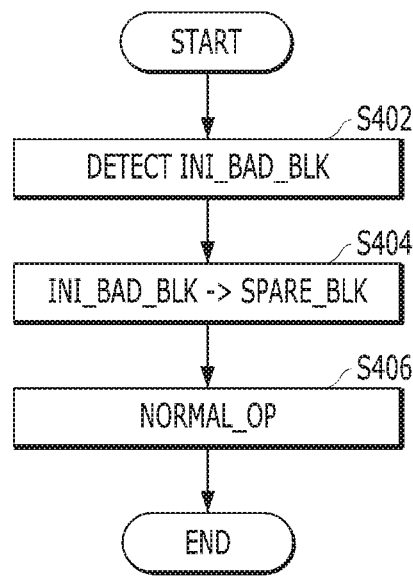
FIG. 4 is a flowchart of a method of forming a super memory block according to a prior art when a super block group includes an initial bad block.

FIG. 4 is a flowchart of a method of forming a super memory block according to a prior art when a super block group includes an initial bad block.

In step S402, the controller 130 may detect initial bad blocks INI_BAD_BLK among the memory blocks included in a super block group SUPER_GROUP. As described above with reference to FIG. 3, the initial bad block INI_BAD_BLK may be a memory block determined to be a bad block in a test that is performed after a manufacturing process. When all of the memory blocks of the same index are normal blocks, the controller 130 may form a super memory block with the normal memory blocks of the same index. The controller 130 may thus form super memory blocks corresponding to the remaining indices except for the indices to which the memory blocks detected as the initial bad blocks INI_BAD_BLK in the super block group SUPER_GROUP with the memory blocks that share the remaining indices.

In step S404, the controller 130 may replace the memory blocks that are detected as the initial bad blocks INI_BAD_BLK in the step S402 with the spare memory blocks that belong to the same planes as the initial bad blocks among the memory blocks included in a spare group SPARE_GROUP. The controller 130 may perform a re-mapping operation of mapping the addresses of the initial bad blocks INI_BAD_BLK to the addresses of the spare memory blocks included in the spare group SPARE_GROUP so as to replace the initial bad blocks INI_BAD_BLK with the spare memory blocks included in the spare group SPARE_GROUP. When it is determined, as a result of performing the re-mapping operation, that the memory blocks sharing the index to which the memory block detected as the initial bad blocks INI_BAD_BLK are all normal blocks, the controller 130 may form a super memory block with the spare memory blocks replacing the initial bad blocks INI_BAD_BLK and the normal memory blocks of the same index as the initial bad blocks INI_BAD_BLK.

Figure 5:
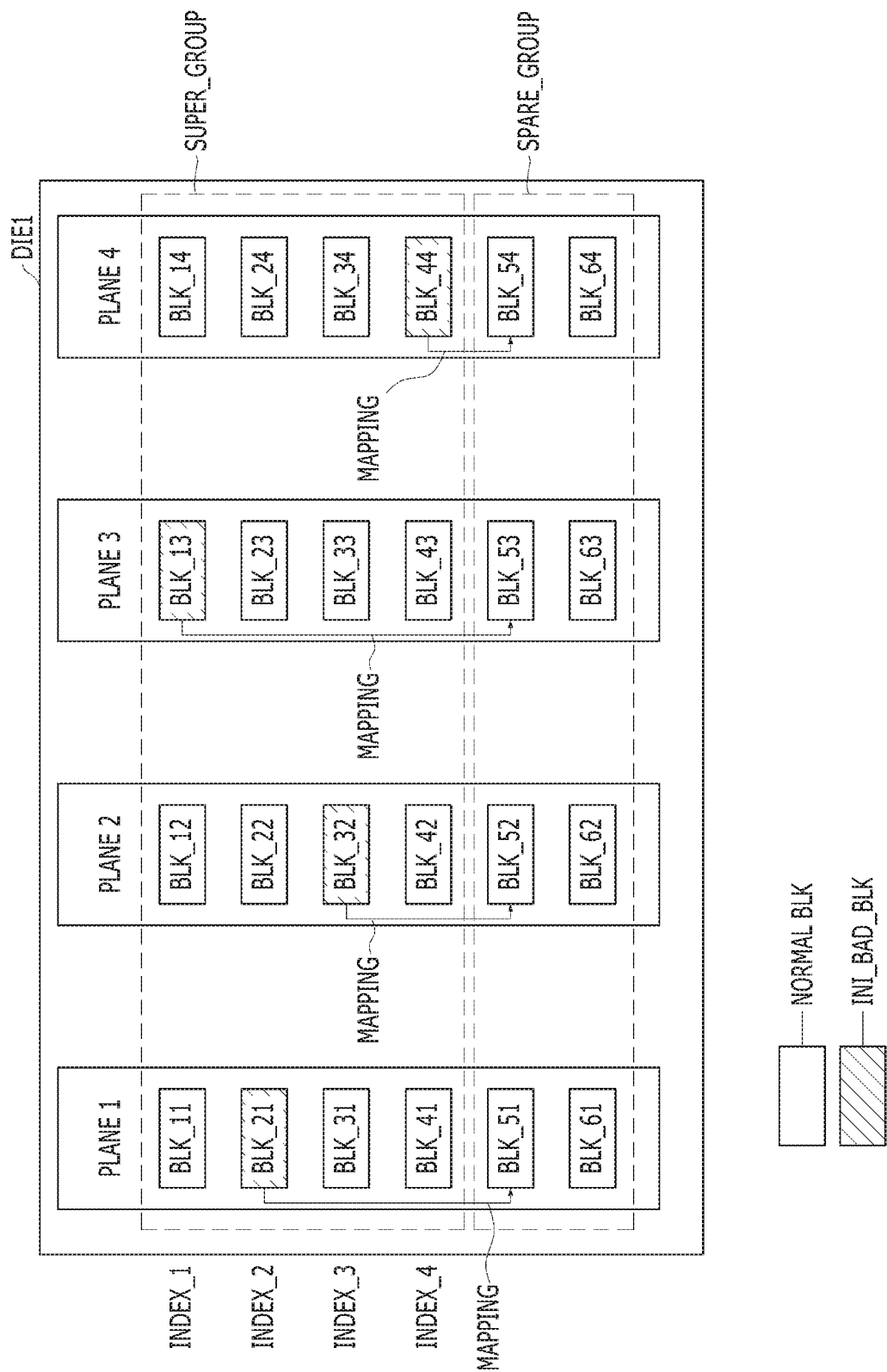
FIG. 5 is a block diagram illustrating an operation of replacing an initial bad block with a normal block.

FIG. 5 is a block diagram illustrating an operation of replacing an initial bad block with a normal block.

In the example of FIG. 5, a first die DIE1 includes first to fourth planes PLANE1 to PLANE4, and each of the first to fourth planes PLANE1 to PLANE4 includes six memory blocks.

The controller 130 may detect a memory block which is an initial bad block INI_BAD_BLK among the memory blocks included in the super block group SUPER_GROUP. For example, the controller 130 may detect, as the initial bad blocks INI_BAD_BLK, a second memory block BLK_21 included in the first plane PLANE1, a third memory block BLK_32 included in the second plane PLANE2, a first memory block BLK_13 included in the third plane PLANE3, and a fourth memory block BLK_44 included in the fourth plane PLANE4. The controller 130 may then replace the initial bad blocks BLK_21, BLK_32, BLK_13, and BLK_44 with spare memory blocks that belong to the same planes as the initial bad blocks BLK_21, BLK_32, BLK_13, and BLK_44, respectively, among the spare memory blocks included in the spare group SPARE_GROUP.

For example, the controller 130 may replace the second memory block BLK_21, which is detected as an initial bad block INI_BAD_BLK, with a spare block by mapping the address of the second memory block BLK_21 to the fifth memory block BLK_51 included in the first plane PLANE1 among the spare memory blocks included in the spare group SPARE_GROUP. The controller 130 may perform a re-mapping operation of replacing each of the initial bad blocks BLK_21, BLK_32, BLK_13 and BLK_44 with spare blocks BLK51, BLK52, BLK53 and BLK54 included in the spare group SPARE_GROUP so as to include the spare blocks BLK51, BLK52, BLK53 and BLK54 into the super block group SUPER_GROUP. Since all the memory blocks included in each of the first to fourth indices INDEX1 to INDEX4 are normal blocks as a result of the re-mapping operation, the controller 130 may form super memory blocks respectively corresponding to the first to fourth indices INDEX1 to INDEX4.

Referring back to FIG. 4, in step S406, after the super memory blocks are formed in the steps S402 and S404, the controller 130 may control the memory device 150 to perform a program operation or an erase operation (which are, hereinafter, referred to as a normal operation NORMAL_OP) on the basis of a unit of a super memory block. The memory blocks included in the super memory block are physically different memory blocks, but they may operate logically as one memory block. For example, the controller 130 may control the memory device 150 to simultaneously perform the normal operation NORMAL_OP on the memory blocks included in the super memory block. The controller 130 may improve the performance of the normal operation NORMAL_OP by controlling the memory device 150 to perform the normal operation NORMAL_OP on the basis of the unit of a super memory block.

Figure 6:
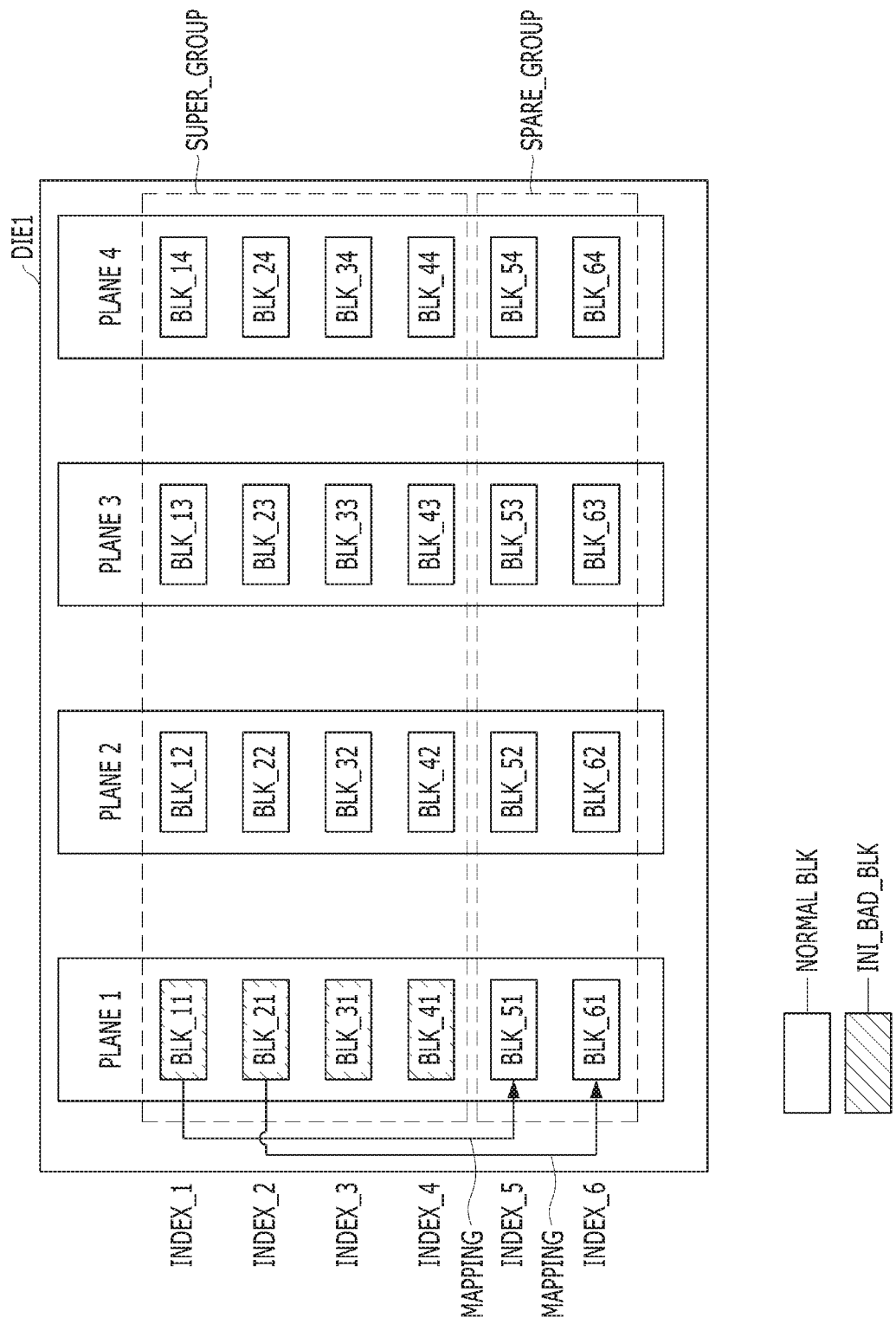
FIG. 6 is a block diagram illustrating a problem that occurs when a super memory block is formed according to a prior art method.

FIG. 6 is a block diagram illustrating a problem that occurs when a super memory block is formed according to a prior art.

As described above with reference to FIGS. 4 and 5, according to the prior art, the controller 130 may form a super memory block with the memory blocks when all the memory blocks of the same index are normal blocks. Accordingly, in the case of the index to which an initial bad block INI_BAD_BLK belongs, there is a problem in that the memory space is wasted because the controller 130 may not form the super memory block with the remaining normal blocks due to the initial bad block INI_BAD_BLK among the memory blocks belonging to the index. As described above, according to the prior art, the controller 130 may obtain memory space as it replaces the initial bad block INI_BAD_BLK with a spare block included in the spare group SPARE_GROUP by performing a re-mapping operation. However, since the number of the spare blocks included in the spare group SPARE_GROUP is limited, there may still remain initial bad blocks INI_BAD_BLK in the super block group SUPER_GROUP even after the re-mapping operation is performed. In particular, in the case where initial bad blocks are concentrated on a specific plane, the size of the memory space that may be obtained by performing the re-mapping operation may be small.

In FIG. 6, a case where the number of the initial bad blocks INI_BAD_BLK included in the super block group SUPER_GROUP is four but the initial bad blocks INI_BAD_BLK are concentrated in the first plane PLANE1 is taken and described as an example.

The controller 130 may detect, as the initial bad blocks INI_BAD_BLK, the first to fourth memory blocks BLK11 to BLK41 that are included in the first plane PLANE1. Whereas the number of the initial bad blocks BLK11 to BLK41 included in the first plane PLANE1 is four, the number of the spare memory blocks BLK51 to BLK61 included in the first plane PLANE1 to which the initial bad blocks BLK11 to BLK41 belong among the spare memory blocks included in the spare group SPARE_GROUP is only two. Therefore, the controller 130 may replace only two initial bad blocks INI_BAD_BLK with the two spare blocks BLK51 to BLK61 through a re-mapping operation.

For example, the controller 130 may replace the first memory block BLK11 and the second memory block BLK21 among the initial bad blocks BLK11 to BLK41 included in the first plane PLANE1 with the fifth the memory block BLK51 and the sixth memory block BLK61. The remaining initial bad blocks BLK31 to BLK41 in the first plane PLANE1 may still remain in the super block group SUPER_GROUP. Therefore, the controller 130 may not form a super memory block with memory blocks sharing the third index INDEX3 and the fourth index INDEX4 due to the remaining initial bad blocks BLK31 to BLK41, which causes a problem of wasting the memory space.

According to an embodiment of the present invention, when the super block group SUPER_GROUP still includes the initial bad block INI_BAD_BLK even after the re-mapping operation is performed, the controller 130 may form a short super memory block with the memory blocks sharing an index to which the initial bad block INI_BAD_BLK belongs.

For example, the controller 130 may obtain more memory space by controlling the memory device 150 to access the normal blocks in the short super memory block, even when the initial bad blocks INI_BAD_BLK are concentrated on a particular plane.

Figure 7:
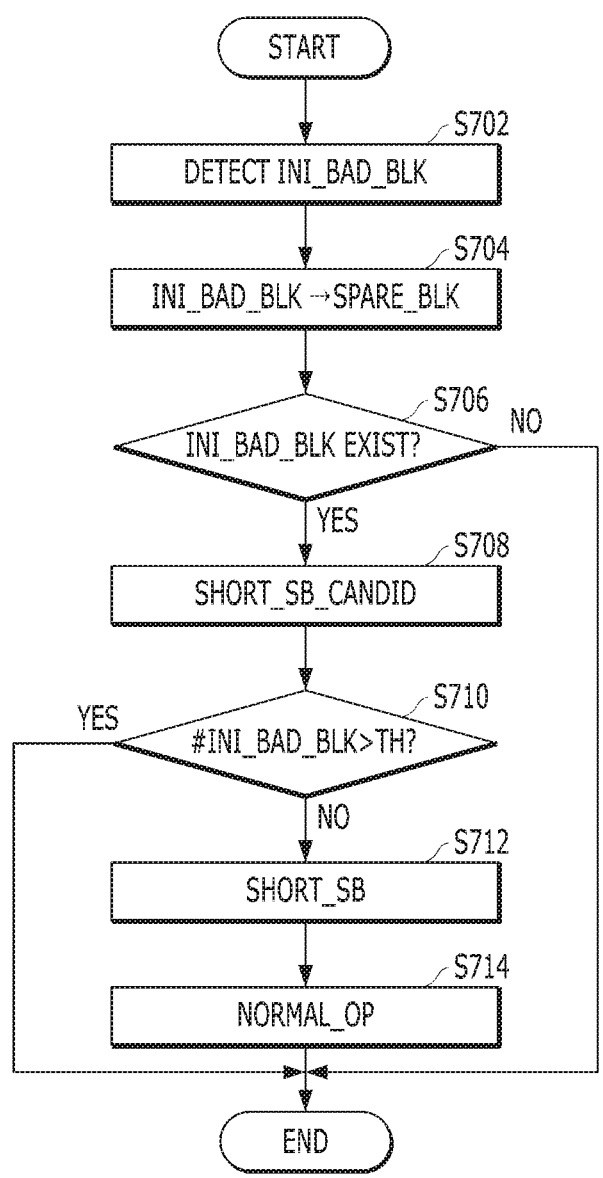
FIG. 7 is a flowchart of an operation of a memory system 110 in accordance with an embodiment of the present invention.

FIG. 7 is a flowchart of an operation of the memory system 110 in accordance with an embodiment of the present invention.

In step S702, the controller 130 may detect an initial bad block INI_BAD_BLK included in a super block group SUPER_GROUP. As described above, the initial bad block INI_BAD_BLK may be a memory block that is determined to be a bad block in a test performed after the manufacturing process. The controller 130 may store address information for the initial bad block INI_BAD_BLK in a separate storage space.

In step S704, the controller 130 may replace the initial bad block INI_BAD_BLK with a spare block SPARE_BLK of the same plane as the initial bad block INI_BAD_BLK. As described earlier with reference to FIG. 3, the spare group SPARE_GROUP may include only normal blocks. Hence, and the spare block SPARE_BLK which replaces the initial bad block INI_BAD_BLK is a memory block among the memory blocks included in the spare group SPARE_GROUP which belongs to the same plane as the plane to which the initial bad block INI_BAD_BLK belongs. The controller may perform a re-mapping operation of mapping the address of the initial bad block INI_BAD_BLK to the address of the spare block SPARE_BLK by referring to the address information of the initial bad block INI_BAD_BLK which is separately stored in the step S702. According to the re-mapping operation, the controller 130 may include the spare block SPARE_BLK in the super block group SUPER_GROUP. The controller 130 may store the changed address information in a separate storage space according to the re-mapping operation.

In step S706, the controller 130 may check whether an initial bad block INI_BAD_BLK remains in the super block group SUPER_GROUP despite the re-mapping operation. When an initial bad block INI_BAD_BLK does not remain in the super block group SUPER_GROUP i.e., when the super block group SUPER_GROUP includes only normal blocks according to the re-mapping operation performed in the step S704 ('N' in the step S706), the controller 130 may form a super block group with the normal memory blocks sharing the same index among the memory blocks included in the SUPER_GROUP.

When an initial bad block INI_BAD_BLK remains in the super block group SUPER_GROUP despite the re-mapping operation ('Y' in the step S706), the controller 130 may detect a short super block candidate group SHORT_SB_CANDID in step S708. The controller 130 may form one short super block candidate with memory blocks of the same index as the initial bad block INI_BAD_BLK included in the super block group SUPER_GROUP. For each index, the controller 130 may detect a single short super block candidate and there may be one or more initial bad blocks INI_BAD_BLK of different planes. Therefore, a single short super block candidate of each index may correspond to one or more initial bad blocks INI_BAD_BLK.

In step S710, the controller 130 may compare a number of the initial bad blocks INI_BAD_BLK corresponding to each short super block candidate within the short super block candidate group SHORT_SB_CANDID with a predetermined threshold value TH. When the number of the initial bad blocks INI_BAD_BLK corresponding to a short super block candidate within the short super block candidate group SHORT_SB_CANDID is larger than the predetermined threshold value TH ('Y' in the step S710), the controller 130 may designate all the memory blocks within the short super block candidate as bad blocks.

In step S712, when the number of the initial bad blocks INI_BAD_BLK corresponding to a short super block candidate is equal to or less than the predetermined threshold TH ('N' in the step S710), the controller 130 may form a short super block SHORT_SB with the normal memory blocks corresponding to the short super block candidate. As described above with reference to FIG. 9, the controller 130 may generate a bitmap representing whether the memory blocks included in the short super block SHORT_SB are normal blocks or initial bad blocks INI_BAD_BLK. The controller 130 may control the memory device 150 to access only the normal blocks among the memory blocks included in the short super block SHORT_SB based on the generated bitmap.

Figure 8:
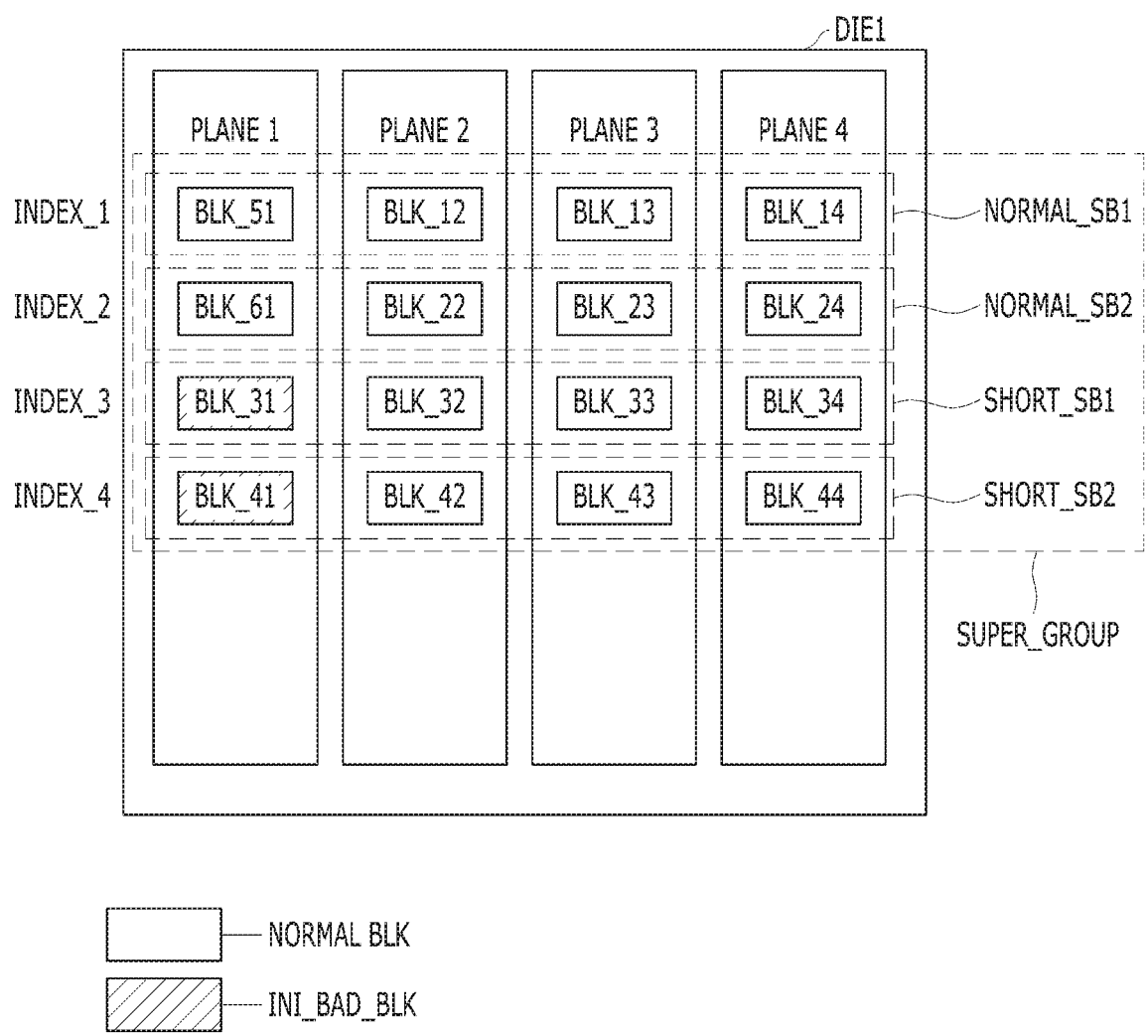
FIG. 8 is a block diagram illustrating a short super block in accordance with an embodiment of the present invention.

FIG. 8 is a block diagram illustrating a short super block in accordance with an embodiment of the present invention.

FIG. 8 exemplarily illustrates a super block group SUPER_GROUP included in the first die DIE1 after the re-mapping operation is performed in the example illustrated in FIG. 5. FIG. 8 illustrates a state where the first memory block BLK_11 and the second memory block and BLK_21 included in the first plane PLANE1 in the super block group SUPER_GROUP shown in FIG. 5 are replaced with the spare memory blocks, i.e., the fifth memory block BLK_51 and the sixth memory block BLK_61 included in the plane PLANE1 according to the re-mapping operation.

Since the memory blocks BLK_51, BLK_12, BLK_13, and BLK_14 of the first index INDEX1 are all normal blocks, the controller 130 may form a first super memory block NORMAL_SB1 with the memory blocks BLK_51, BLK_12, BLK_13, and BLK_14. Similarly, since the memory blocks BLK_61, BLK_22, BLK_23, and BLK_24 of the second index INDEX2 are all normal blocks, the controller 130 may form a second super memory block NORMAL_SB2 with the memory blocks BLK_61, BLK_22, BLK_23, and BLK_24.

Since the third memory block BLK_31 of the third index INDEX3 included in the first plane PLANE1 is an initial bad block INI_BAD_BLK, the controller 130 may designate the memory blocks BLK_31, BLK_32, BLK_33 and BLK_34 of the third index INDEX3 as a first short super block candidate. When the number of the initial bad blocks INI_BAD_BLK included in the first short super block candidate is equal to or less than the predetermined threshold value TH, the controller 130 may form the first short super block SHORT_SB1 with the memory blocks BLK_31, BLK_32, BLK_33 and BLK_34 included in the first short super block candidate. For example, when the predetermined threshold value TH is 2, since the number of the initial bad blocks BLK31 included in the first short super block candidate is 1, which is less than the predetermined threshold value TH, the controller 130 may form the first short super block SHORT_SB1 with the memory blocks BLK_31, BLK_32, BLK_33, and BLK_34 included in the first short super block candidate. Similarly, the controller 130 may form the second short super block SHORT_SB2 with the memory blocks BLK_41, BLK_42, BLK_43, and BLK_44 of the fourth index INDEX4. The controller 130 may generate a bitmap representing whether the memory blocks included in the short super blocks SHORT_SB1 and SHORT_SB2 and the super memory blocks NORMAL_SB1 and NORMAL_SB2 included in the super block group SUPER_GROUP are normal blocks or initial bad blocks INI_BAD_BLK.

FIG. 9 illustrates a bitmap in accordance with an embodiment of the present invention.

For the sake of convenience, a bitmap 902 corresponding to the super block group SUPER_GROUP described with reference to FIG. 8 will be taken and described as an example.

The controller 130 may generate the bitmap 902 representing whether or not the memory blocks included in the short super blocks SHORT_SB1 and SHORT_SB2 and the super memory blocks NORMAL_SB1 and NORMAL_SB2 included in the super block group SUPER_GROUP have integrity. The bitmap 902 may include as many rows as the sum of the number of the super memory blocks NORMAL_SB1 and NORMAL_SB2 and the number of the short super blocks SHORT_SB1 and SHORT_SB2. Also, the bitmap 902 may include as many columns as the number of memory blocks that form each of the super memory blocks NORMAL_SB1 and NORMAL_SB2 and the short super blocks SHORT_SB1 and SHORT_SB2. For example, the bitmap 902 may include four rows, the number of which is the same as the sum of the number of the super memory blocks NORMAL_SB1 and NORMAL_SB2 and the number of the short super blocks SHORT_SB1 and SHORT_SB2 included in the super block group SUPER_GROUP shown in FIG. 8, and may include four columns, the number of which is the same as the number of memory blocks that form each of the super memory blocks NORMAL_SB1 and NORMAL_SB2 and the short super blocks SHORT_SB1 and SHORT_SB2.

According to the embodiment of the present invention, when one memory block among the memory blocks forming each of the super memory blocks NORMAL_SB1 and NORMAL_SB2 and the short super blocks SHORT_SB1 and SHORT_SB2 is a normal block, the controller 130 may record a value of '1' in an element of the bitmap 902 corresponding to the memory block. Also, when one memory block among the memory blocks forming each of the super memory blocks NORMAL_SB1 and NORMAL_SB2 and the short super blocks SHORT_SB1 and SHORT_SB2 is an initial bad block INI_BAD_BLK, the controller 130 may record a value of '0' in an element of the bitmap 902 corresponding to the memory block.

For example, since the third memory block BLK31 included in the first short super block SHORT_SB1 is an initial bad block INI_BAD_BLK, the controller 130 may record a value of '0' in an element of the bitmap 902 positioned in a third row corresponding to the third index INDEX3 to which the third memory block BLK31 belongs and a first column corresponding to the first plane PLANE1 to which the third memory block BLK31 belongs. Also, since the fourth memory block BLK42 included in the second short super block SHORT_SB2 is a normal block, the controller 130 may record a value of '1' in an element of the bitmap 902 positioned in a fourth row corresponding to the fourth index INDEX4 to which the fourth memory block BLK42 belongs and a second column corresponding to the second plane PLANE2 to which the fourth memory block BLK42 belongs.

Referring back to FIG. 7, in step S714, the controller 130 may control the memory device 150 to access only the normal blocks among the memory blocks included in the short super block SHORT_SB based on the bit map 902 described with reference to FIG. 9. The memory device 150 may perform a normal operation NORMAL_OP on the basis of a unit of a short super block under the control of the controller 130. The memory device 150 may improve the performance of a program operation or an erase operation by simultaneously performing a program operation or an erase operation on the normal blocks included in the short super block SHORT_SB.

For example, when a plurality of program commands and program data are provided from the host 102, the controller 130 may detect the number of the normal blocks included in the short super block SHORT_SB in the bitmap 902. The controller 130 may calculate the size of data that may be simultaneously programmed into the normal blocks included in the short super block SHORT_SB based on the detected number of the normal blocks included in the short super block SHORT_SB. The controller 130 may control the memory device 150 to simultaneously program the program data into the normal blocks included in the short super block SHORT_SB by providing the memory device 150 with the program data having the above-calculated data size, a program command corresponding to the calculated data size, and the program command corresponding to the program data.

According to the embodiment of the present invention, when initial bad blocks INI_BAD_BLK are concentrated on a particular plane and there still remain initial bad blocks INI_BAD_BLK even after a re-mapping operation is performed and the number of the initial bad blocks INI_BAD_BLK of an index is equal to or less than the predetermined threshold value TH, the controller 130 may still form the short super block SHORT_SB with the normal memory blocks of the index. The controller 130 may generate a bitmap representing whether the memory blocks included in the short super block SHORT_SB are normal blocks or initial bad blocks INI_BAD_BLK, and may control the memory device 150 to access only the normal blocks among the memory blocks included in the short super block SHORT_SB to perform a normal operation NORMAL_OP. Therefore, the controller 130 may obtain more memory space by using the normal blocks included in the short super block to perform the normal operation NORMAL_OP.

Figure 10:
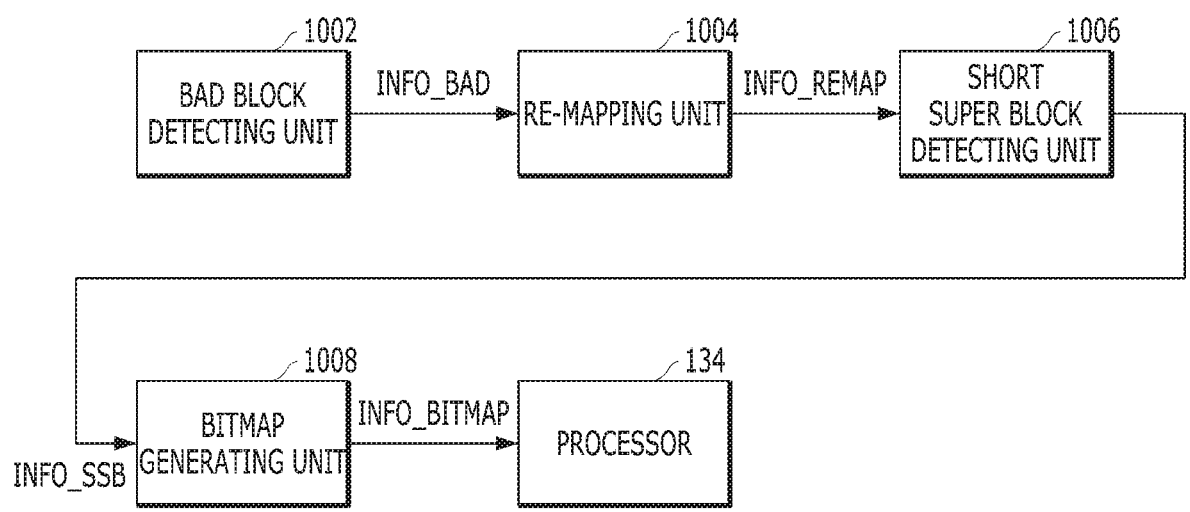
FIG. 10 is a block diagram illustrating a memory system 110 in accordance with an embodiment of the present invention.

FIG. 10 is a block diagram illustrating the memory system 110 in accordance with an embodiment of the present invention. FIG. 10 schematically shows only the constituent elements related to the present invention in the data processing system 100 of FIG. 1.

The controller 130 may further include a bad block detecting unit 1002, a re-mapping unit 1004, a short super block detecting unit 1006, and a bitmap generating unit 1008.

The bad block detecting unit 1002 may detect an initial bad block INI_BAD_BLK included in the super block group SUPER_GROUP. The initial bad block INI_BAD_BLK may be a memory block that is determined to be a bad block in a test performed after a manufacturing process. The bad block detecting unit 1002 may provide the re-mapping unit 1004 with address information INFO_BAD on the detected initial bad block.

The re-mapping unit 1004 may replace the initial bad block INI_BAD_BLK with a spare block SPARE_BLK based on the provided address information INFO_BAD on the initial bad block. The spare group SPARE_GROUP may include only normal blocks, and the spare block SPARE_BLK may be a memory block belonging to the same plane as the plane to which the initial bad block INI_BAD_BLK belongs among the memory blocks included in the spare group SPARE_GROUP. The re-mapping unit 1004 may refer to the address information INFO_BAD on the initial bad block, and performs a re-mapping operation of mapping the address of the initial bad block INI_BAD_BLK to the address of the spare block SPARE_BLK. According to the re-mapping operation, the re-mapping unit 1004 may include the spare block SPARE_BLK in the super block group SUPERGROUP. The re-mapping unit 1004 may provide the short superblock detecting unit 1006 with information INFO_REMAP on the changed address according to the re-mapping operation.

The short super block detecting unit 1006 may form, when one or more initial bad blocks remain in an original super block after a re-mapping operation is performed and a number of the initial bad blocks is equal to or less than a predetermined threshold value within the original super block, a short super block with memory blocks included in the original super block.

The short super block detecting unit 1006 may detect a short super block candidate group SHORT_SB_CANDID when the super block group SUPER_GROUP still includes an initial bad block INI_BAD_BLK based on the information INFO_REMAP for the provided changed address according to the re-mapping operation. The short super block detecting unit 1006 may form one super block candidate with memory blocks of the same index as the initial bad block INI_BAD_BLK included in the super block group SUPER_GROUP. The short super block detecting unit 1006 may detect a set of short super block candidates respectively corresponding to the initial bad blocks INI_BAD_BLK included in the super block group SUPER_GROUP as the short super block candidate group SHORT_SB_CANDID.

The short super block detecting unit 1006 may compare the number of the initial bad blocks INI_BAD_BLK corresponding to each short super block candidate within the short super block candidate group SHORT_SB_CANDID with a predetermined threshold value TH. When the number of the initial bad blocks INI_BAD_BLK corresponding to a short super block candidate is equal to or less than the predetermined threshold value TH, the short super block detecting unit 1006 may form a short super block SHORT_SB with the memory blocks included in the short super block candidate. The short super block detecting unit 1006 may provide the bitmap generating unit 1008 with information INFO_SSB on the formed short super block SHORT_SB.

The bitmap generating unit 1008 may generate a bitmap representing whether each of the memory blocks included in the short super block is a normal block or the initial bad block.

The bitmap generating unit 1008 may generate a bitmap representing whether the memory blocks included in the short super block SHORT_SB are normal blocks or initial bad blocks INI_BAD_BLK based on the provided information INFO_SSB on the short super block. According to the embodiment of the present invention, as described above with reference to FIG. 9, when one memory block among the memory blocks forming each of the super memory blocks NORMAL_SB1 and NORMAL_SB2 and the short super blocks SHORT_SB1 and SHORT_SB2 is a normal block, the bitmap generating unit 1008 may record a value of '1' in an element of the bitmap 902 corresponding to the memory block. Also, when one memory block among the memory blocks forming each of the super memory blocks NORMAL_SB1 and NORMAL_SB2 and the short super blocks SHORT_SB1 and SHORT_SB2 is an initial bad block INI_BAD_BLK, the bitmap generating unit 1008 may record a value of '0' in an element of the bitmap 902 corresponding to the memory block. The bitmap generating unit 1008 may provide the processor 134 with information INFO_BITMAP on the generated bitmap.

The processor 134 may control the memory device 150 to simultaneously perform a normal operation on the normal blocks included in the short super block based on the bitmap.

The processor 134 may control the memory device 150 to access only the normal blocks among the memory blocks included in the short super block SHORT_SB based on the provided information INFO_BITMAP on the bitmap. The memory device 150 may perform a normal operation NORMAL_OP on the basis of the unit of a short super block under the control of the processor 134. The memory device 150 may improve the performance of a program operation or an erase operation by simultaneously performing a program operation or an erase operation on the normal blocks included in the short super block SHORT_SB.

Hereinafter, a memory device in a memory system in accordance with an embodiment of the present invention will be described in more detail with reference to FIGS. 11 to 13.

Figure 11:
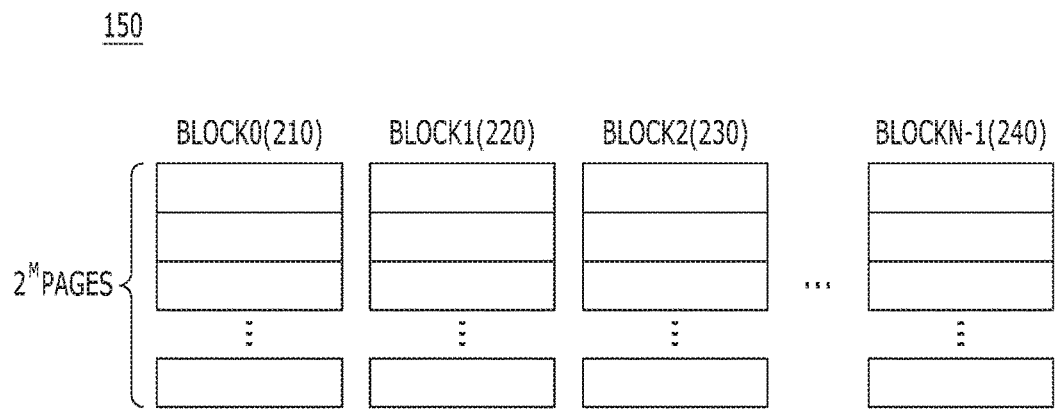
FIG. 11 is a diagram illustrating a configuration of a memory device including a plurality of memory blocks employed in the memory system shown in FIG. 1.

FIG. 11 is a schematic diagram illustrating the memory device 150. FIG. 12 is a circuit diagram illustrating a configuration of a memory cell array of a memory block 330 in the memory device 150. FIG. 13 is a schematic diagram illustrating a 3D structure of the memory device 150.

Referring to FIG. 11, the memory device 150 may include a plurality of memory blocks BLOCK0 to BLOCKN−1, where N is an integer greater than 1. Each of the blocks BLOCK0 to BLOCKN−1 may include a plurality of pages, for example, $2^M$ or M pages, the number of which may vary according to circuit design, M being an integer greater than 1. Each of the pages may include a plurality of memory cells that are coupled to a plurality of word lines WL.

Also, memory cells in the respective memory blocks BLOCK0 to BLOCKN−1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Instead of a nonvolatile memory, the memory device 150 may be implemented by any one of a phase change random access memory (PCRAM), a resistive random access memory (RRAM(ReRAM)), a ferroelectrics random access memory (FRAM), and a spin transfer torque magnetic random access memory (STT-RAM(STT-M RAM)).

The memory blocks 210, 220, 230, 240 may store the data transferred from the host 102 through a program operation, and may transfer data stored therein to the host 102 through a read operation.

Figure 12:
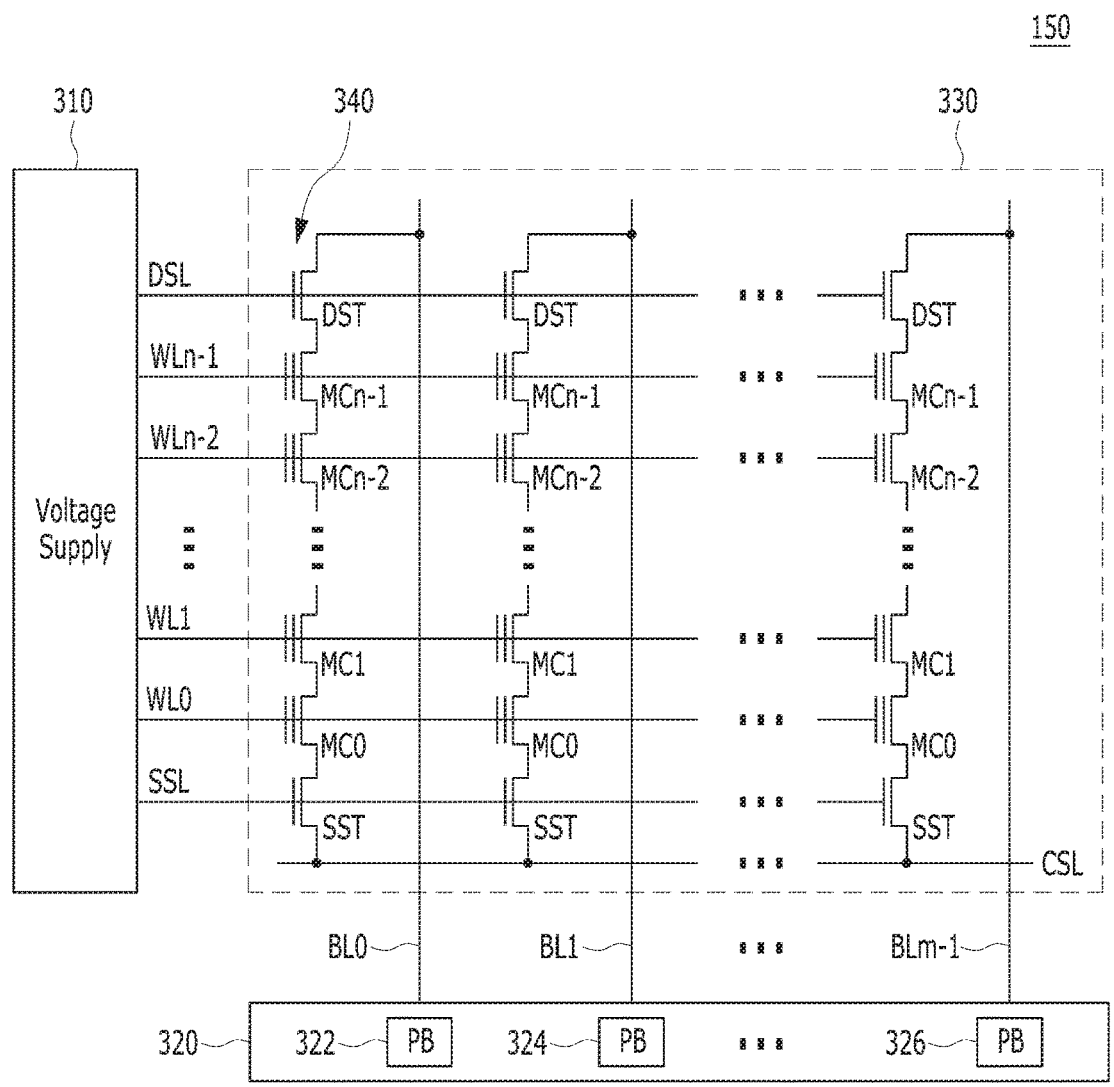
FIG. 12 is a circuit diagram illustrating a configuration of a memory cell array of a memory block in the memory device shown in FIG. 1.
Figure 13:
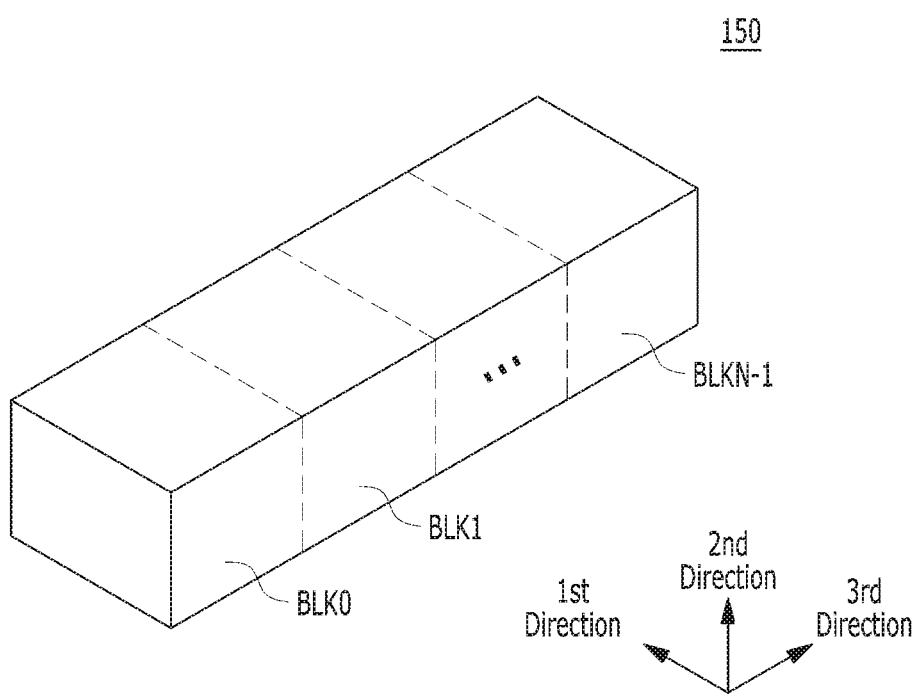
FIG. 13 is a block diagram illustrating a structure of a memory device of a memory system in accordance with an embodiment of the present invention.

Referring to FIG. 12, the memory block 330 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 13, the first cell string is coupled to the first bit line BL0, and the last cell string is coupled to the last bit line BLm−1.

Although FIG. 12 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 13, the memory device 150 may be embodied by a nonvolatile memory device having a 3D stack structure. When the memory device 150 has a 3D structure, the memory device 150 may include a plurality of memory blocks BLK0 to BLKN−1. Herein, FIG. 13 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may include structures of a three-dimensional structure that are extended in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Herein, memory cells MC may be provided between the string selection transistor SST and the ground selection transistor GST of each NAND string NS. In other words, a plurality of memory cells may be realized in each memory block 330 of the memory blocks 152, 154 and 156 of the memory device 150.

Hereafter, a data processing system and electronic devices to which the memory system 110 including the memory device 150 and the controller 130 is applied, which are described above by referring to FIGS. 1 to 13, in accordance with an embodiment of the present invention will be described in detail with reference to FIGS. 14 to 22.

Figure 14:
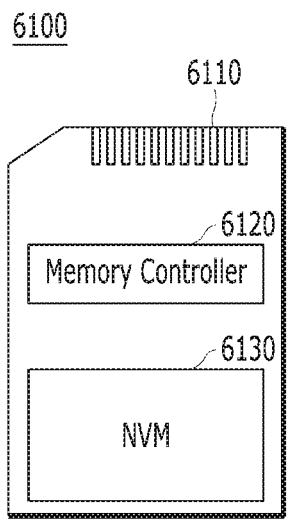
FIGS. 14 to 22 are diagrams schematically illustrating applications of the data processing system in accordance with various embodiments of the present invention.

FIG. 14 is a diagram schematically illustrating another example of the data processing system including the memory system in accordance with an embodiment. FIG. 14 schematically illustrates a memory card system to which the memory system may be applied.

Referring to FIG. 14, the memory card system 6100 may include a memory controller 6120, a memory device 6130 and a connector 6110.

Specifically, the memory controller 6120 may be electrically connected to, and configured to access, the memory device 6130 embodied by a nonvolatile memory. For example, the memory controller 6120 may be configured to control read, write, erase, and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface, and an error correction component.

The memory controller 6120 may communicate with an external device, for example, the host 102 of FIG. 1 through the connector 6110. For example, as described with reference to FIG. 1, the memory controller 6120 may be configured to communicate with an external device through one or more various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or specific mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state driver (SSD). Also, the memory controller 6120 and the memory device 6130 may be so integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and/or a universal flash storage (UFS).

Figure 15:
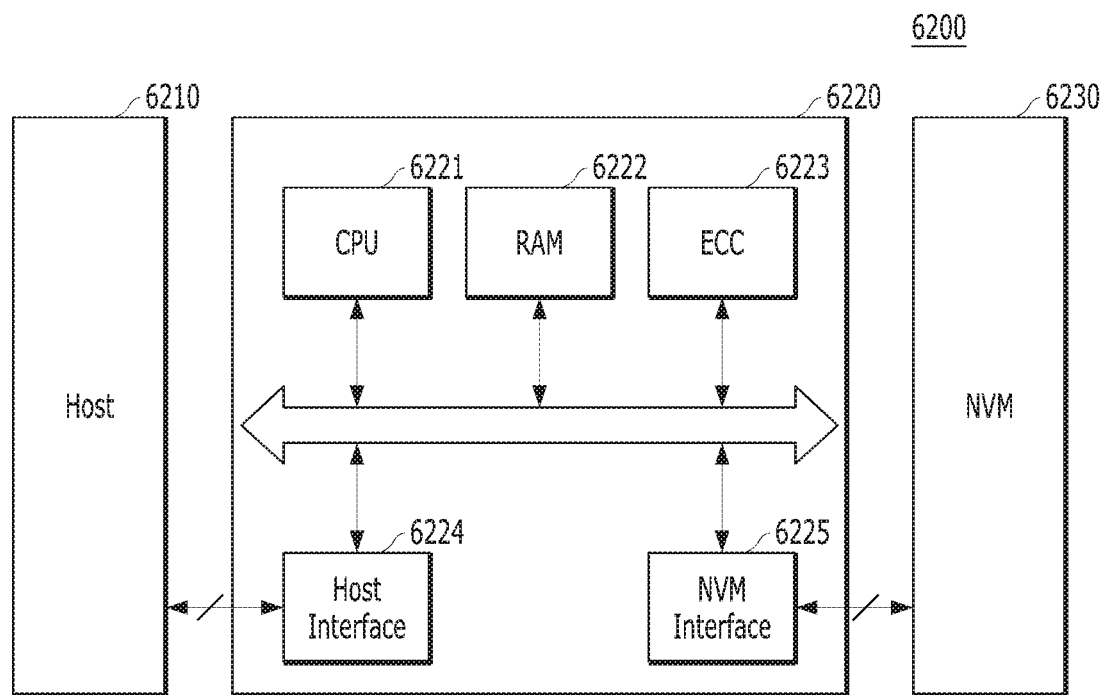

FIG. 15 is a diagram schematically illustrating another example of the data processing system including the memory system in accordance with an embodiment.

Referring to FIG. 15, the data processing system 6200 may include a memory device 6230 having one or more nonvolatile memories and a memory controller 6220 for controlling the memory device 6230. The data processing system 6200 illustrated in FIG. 15 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write, or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management, and bad page management operations. The RAM 6222 may be operated according to control of the CPU 6221, and used as a work memory, buffer memory, or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. The ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 through a PATA bus, a SATA bus, a SCSI, an USB, a PCIe or a NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device according to one or more of various communication protocols, the memory system and the data processing system in accordance with an embodiment may be applied to wired/wireless electronic devices, particularly a mobile electronic device.

Figure 16:
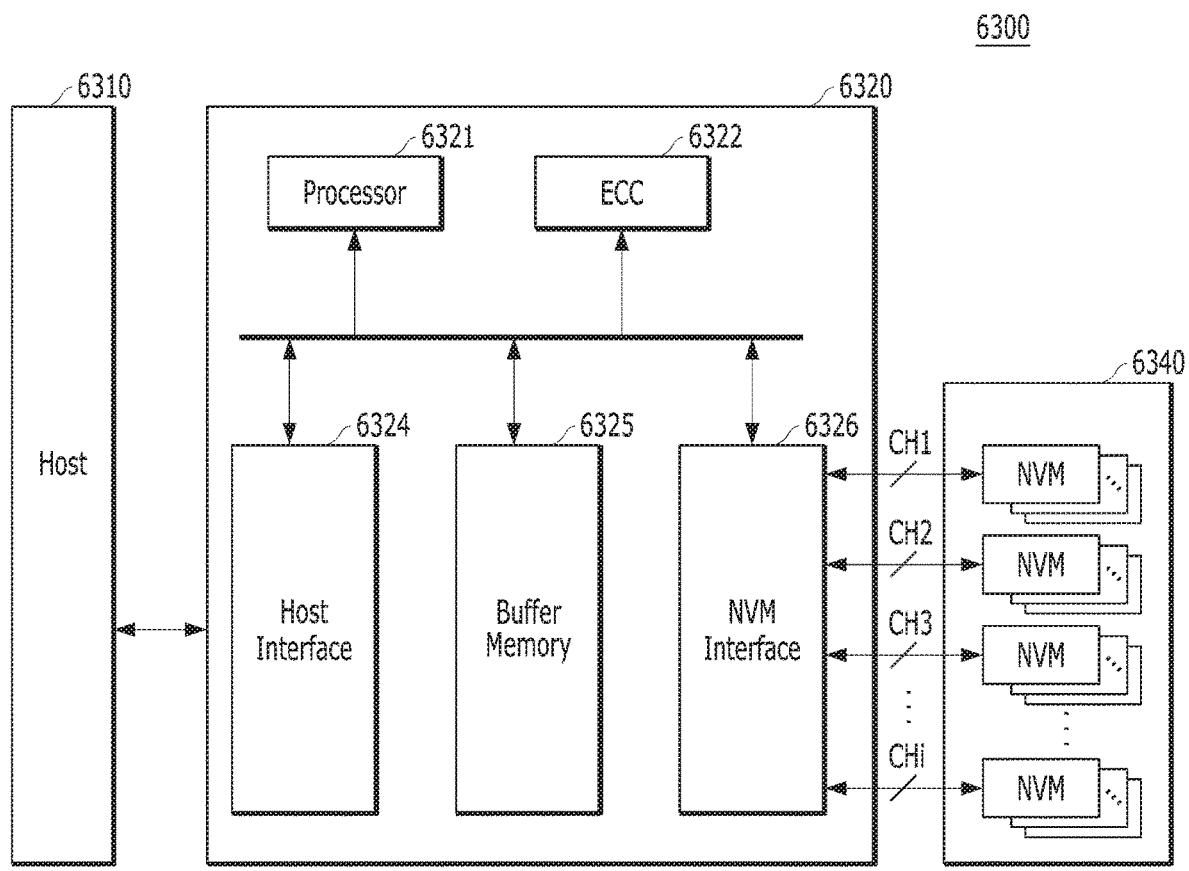

FIG. 16 is a diagram schematically illustrating another example of the data processing system including the memory system in accordance with an embodiment. FIG. 16 schematically illustrates an SSD to which the memory system may be applied.

Referring to FIG. 16, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

Specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a DRAM, a SDRAM, a DDR SDRAM, a LPDDR SDRAM and a GRAM or nonvolatile memories such as a FRAM, a ReRAM, a STT-MRAM and a PRAM. FIG. 16 illustrates that the buffer memory 6325 is embodied in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 may be applied may be provided to embody a data processing system, for example, a RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 17:
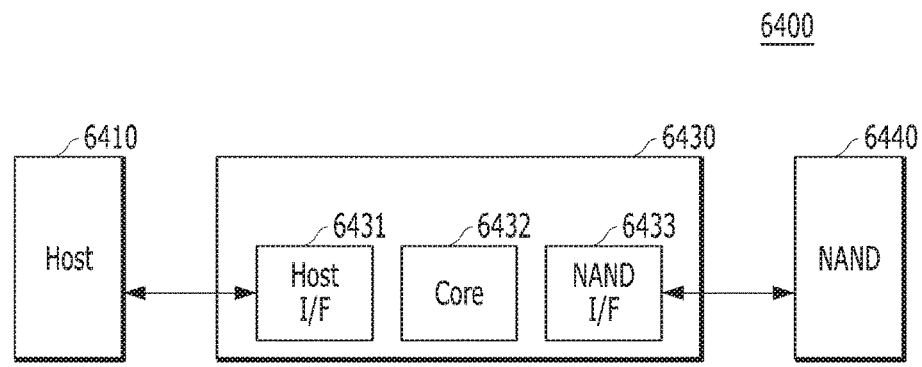

FIG. 17 is a diagram schematically illustrating another example of the data processing system including the memory system in accordance with an embodiment. FIG. 17 schematically illustrates an embedded Multi-Media Card (eMMC) to which the memory system may be applied.

Referring to FIG. 17, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

Specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 18 to 21 are diagrams schematically illustrating other examples of the data processing system including the memory system in accordance with embodiments. FIGS. 18 to 21 schematically illustrate UFS (Universal Flash Storage) systems to which the memory system may be applied.

Referring to FIGS. 18 to 21, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 15 to 17, and the UFS cards 6530, 6630, 6730, 6830 may be embodied in the form of the memory card system 6100 described with reference to FIG. 14.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, for example, an UFDs, a MMC, a SD, a mini-SD, and a micro-SD.

Figure 18:
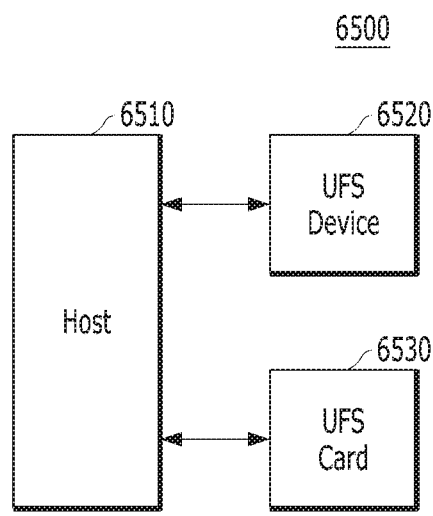

In the UFS system 6500 illustrated in FIG. 18, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6510. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 19:
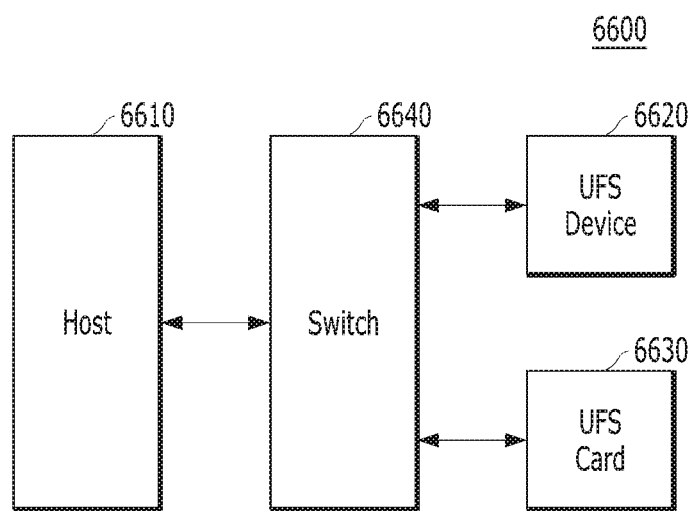

In the UFS system 6600 illustrated in FIG. 19, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 20:
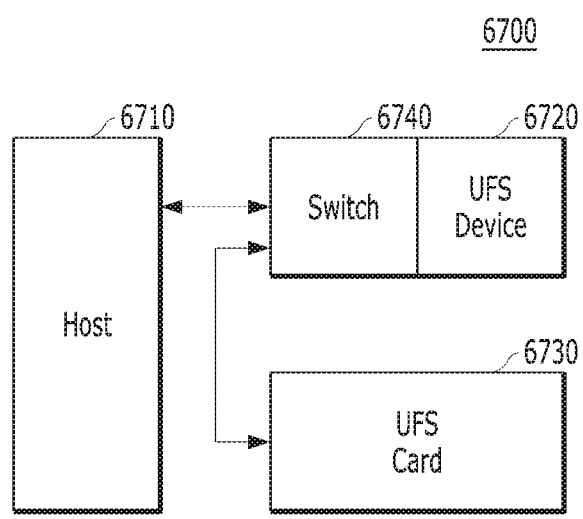

In the UFS system 6700 illustrated in FIG. 20, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 21:
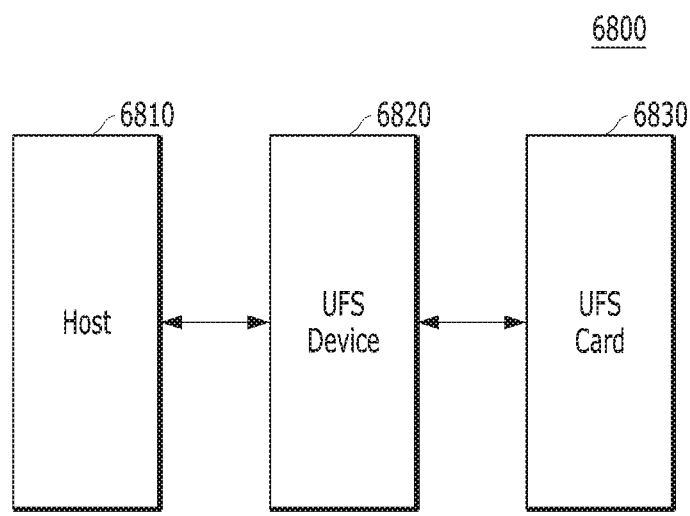

In the UFS system 6800 illustrated in FIG. 21, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810, and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 22:
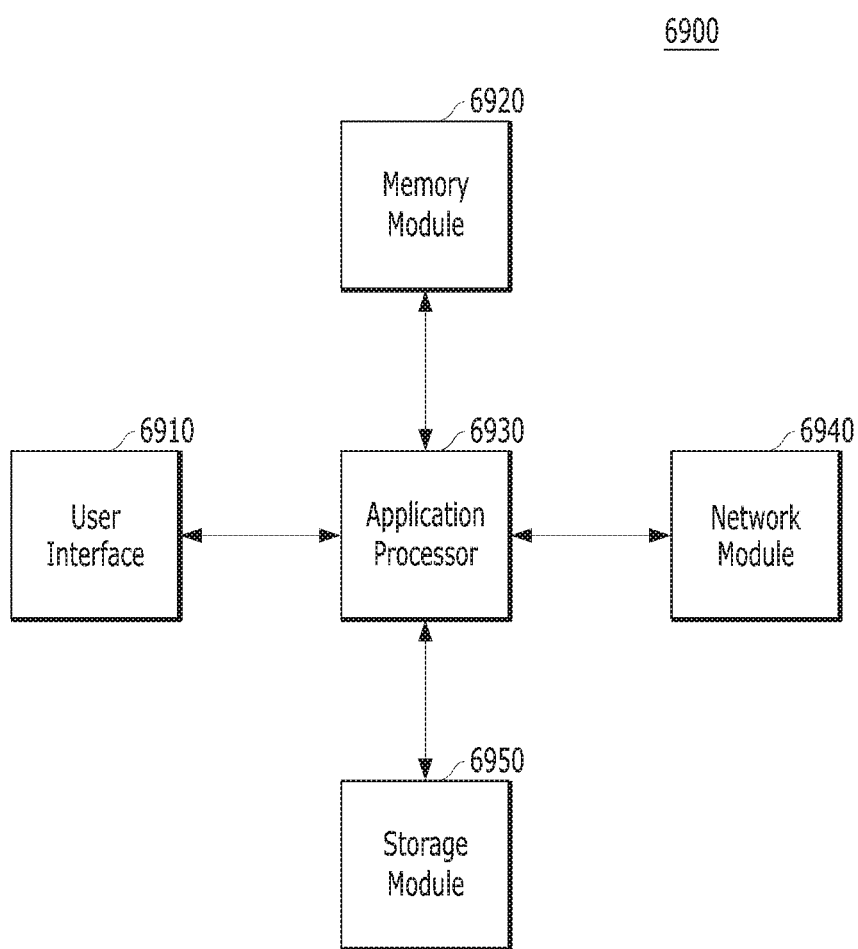

FIG. 22 is a diagram schematically illustrating another example of the data processing system including the memory system in accordance with an embodiment of the present invention. FIG. 22 is a diagram schematically illustrating a user system to which the memory system may be applied.

Referring to FIG. 22, the user system 6900 may include an application processor 6930, a memory module 6920, a network module 6940, a storage module 6950 and a user interface 6910.

Specifically, the application processor 6930 may drive components in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 16 to 21.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiments of the present invention, the memory system may obtain memory space by forming a short super block including an initial bad block.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
   a memory device including a plurality of super blocks;
   a re-mapping unit suitable for forming a re-mapped super block by mapping an address of an initial bad block of a bad super block included in the plurality of super blocks to an address of a normal block included in a spare group;
   a short super block detecting unit suitable for forming, when one or more bad super block remain in the plurality of super blocks after the re-mapped super block is formed and a number of the initial bad blocks is equal to or less than a predetermined threshold value within the remain bad super block, a short super block with memory blocks included in the remain bad super block;
   a bitmap generating unit suitable for generating a bitmap representing whether each of the memory blocks included in each of the plurality of super blocks is a normal block or an initial bad block; and
   a processor suitable for interleaving commands for accessing one of the plurality of super blocks based on a number of normal blocks of the super block by referring to the bitmap and controlling the memory device to simultaneously perform command operations on the normal blocks.

2. The memory system of claim 1, further comprising an initial bad block detecting unit suitable for detecting the initial bad blocks within the original super block and generating address information of the initial bad blocks.

3. The memory system of claim 1, wherein the initial bad block is a memory block that is determined as a bad block in a test performed after a manufacturing process.

4. The memory system of claim 1, wherein the normal block included in the spare group belongs to the same plane as the corresponding initial bad block.

5. The memory system of claim 1, wherein the bitmap generating unit records, when a first memory block included in the short super block is the normal block, a value of '1' in an element corresponding to the first memory block in the bitmap.

6. The memory system of claim 1, wherein the bitmap generating unit records, when a second memory block included in the short super block is the initial bad block, a value of '0' in an element corresponding to the second memory block in the bitmap.

7. The memory system of claim 1, wherein the command operations are program operations or erase operations.

8. The memory system of claim 1, wherein the short super block detecting unit processes, when the number of the initial bad blocks is greater than the predetermined threshold value within the original super block, the memory blocks included in the original super block as bad blocks.

9. A method for operating a memory system including a plurality of super blocks, the method comprising:
   forming a re-mapped super block by mapping an address of an initial bad block of a bad super block included in the plurality of super blocks to an address of a normal block included in a spare group;
   forming, when one or more bad super block remain in the plurality of super blocks after the re-mapped super block is formed and a number of the initial bad blocks is equal to or less than a predetermined threshold value within the remain bad super block, a short super block with memory blocks included in the remain bad super block;
   generating a bitmap representing whether each of the memory blocks included in each of the plurality of super blocks is a normal block or an initial bad block;
   interleaving commands for accessing one of the plurality of super blocks based on a number of normal blocks of the super block by referring to the bitmap; and
   simultaneously performing command operations on the normal blocks.

10. The method of claim 9, further comprising detecting the initial bad blocks within the original super block and generating address information of the initial bad blocks.

11. The method of claim 9, wherein the normal block included in the spare group belongs to the same plane as the corresponding initial bad block.

12. The method of claim 9, wherein the generating of the bitmap includes recording, when a first memory block included in the short super block is the normal block, a value of '1' in an element corresponding to the first memory block in the bitmap.

13. The method of claim 9, wherein the generating of the bitmap includes recording, when a second memory block included in the short super block is the initial bad block, a value of '0' in an element corresponding to the second memory block in the bitmap.

14. The method of claim 9, wherein the command operations are program operations or erase operations.

15. The method of claim 9, further comprising processing, when the number of the initial bad blocks is greater than the predetermined threshold value within the original super block, the memory blocks included in the original super block as bad blocks.

* * * * *